(12) United States Patent
Chamberlain et al.

(10) Patent No.: US 9,764,989 B2
(45) Date of Patent: Sep. 19, 2017

(54) REACTIVE FIBER INTERFACE COATINGS FOR IMPROVED ENVIRONMENTAL STABILITY

(71) Applicant: Rolls-Royce Corporation, Indianapolis, IN (US)

(72) Inventors: Adam L. Chamberlain, Mooresville, IN (US); Sean E. Landwehr, Avon, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 1036 days.

(21) Appl. No.: 14/134,393

(22) Filed: Dec. 19, 2013

(65) Prior Publication Data

US 2016/0159694 A1   Jun. 9, 2016

Related U.S. Application Data

(60) Provisional application No. 61/779,590, filed on Mar. 13, 2013.

(51) Int. Cl.

| | |
|---|---|
| *C04B 35/80* | (2006.01) |
| *C04B 35/565* | (2006.01) |
| *C04B 35/628* | (2006.01) |
| *F01D 5/28* | (2006.01) |
| *C23C 16/32* | (2006.01) |
| *C23C 16/40* | (2006.01) |

(52) U.S. Cl.
CPC ............ *C04B 35/80* (2013.01); *C04B 35/565* (2013.01); *C04B 35/62847* (2013.01); *C04B 35/62855* (2013.01); *C04B 35/62863* (2013.01); *C04B 35/62868* (2013.01); *C04B 35/62894* (2013.01); *C04B 35/62897* (2013.01); *C04B 35/806* (2013.01); *C23C 16/325* (2013.01); *C23C 16/40* (2013.01); *F01D 5/284* (2013.01); *C04B 2235/5244* (2013.01)

(58) Field of Classification Search
CPC ...... C04B 35/62855; C04B 2235/5244; C04B 35/565; C04B 35/62847; C04B 35/62863; C04B 35/62868; C04B 35/62894; C04B 35/62897; C04B 35/80; C04B 35/806; C23C 16/325; C23C 16/40; F01D 5/284
USPC ....... 442/63, 59, 327, 330; 428/293.4, 294.1
See application file for complete search history.

(56) References Cited

U.S. PATENT DOCUMENTS

| | | |
|---|---|---|
| 4,072,516 A | 2/1978 | Pepper et al. |
| 4,481,257 A | 11/1984 | Suplinskas et al. |
| 5,035,923 A | 7/1991 | Sarin |
| 5,252,361 A | 10/1993 | Frechette et al. |

(Continued)

FOREIGN PATENT DOCUMENTS

GB   2467928 A1 * 8/2010 ........... C04B 35/628

OTHER PUBLICATIONS

International Search Report and Written Opinion for International Application No. PCT/US20141023046, Nov. 5, 2014, 13 pages.

(Continued)

*Primary Examiner* — Jennifer Chriss
*Assistant Examiner* — Rebecca Janssen
(74) *Attorney, Agent, or Firm* — Brinks Gilson & Lione

(57) ABSTRACT

A multilayer interface coating for composite material fibers includes a first coating layer deposited onto a fiber and a second coating layer deposited onto the first coating layer.

18 Claims, 4 Drawing Sheets

T > 1000 °C

Silicate formation at interface 36

Crack propagating to fiber 34

- Oxygen slowed down by $SiO_2$ formation
- Crack extends into fiber interface
- $SiO_2$ reacts with rare oxide layer to form silicate with improved water vapor resistance

(56) References Cited

U.S. PATENT DOCUMENTS

| | | |
|---|---|---|
| 5,552,352 A | 9/1996 | Brun et al. |
| 5,580,835 A | 12/1996 | Wright et al. |
| 6,077,605 A | 6/2000 | McGowan et al. |
| 6,322,889 B1 | 11/2001 | Lara-Curzio et al. |
| 6,365,233 B1 | 4/2002 | Corman et al. |
| 6,485,791 B1 | 11/2002 | Nagaraj |
| 6,630,200 B2 | 10/2003 | Wang et al. |
| 6,758,386 B2 | 7/2004 | Marshall et al. |
| 6,797,332 B2 | 9/2004 | Strangman et al. |
| 6,896,968 B2 | 5/2005 | Golecki |
| 8,039,053 B2 | 10/2011 | Philippe et al. |
| 8,061,977 B2 | 11/2011 | Keller et al. |
| 8,124,252 B2 | 2/2012 | Cybulsky et al. |
| 8,137,826 B2 | 3/2012 | Louchet-Pouillerie et al. |
| 2006/0100086 A1* | 5/2006 | Mechnich ............... C04B 35/16 501/103 |
| 2008/0292803 A1 | 11/2008 | Nagaraj et al. |
| 2009/0191353 A1 | 7/2009 | Nagaraj et al. |
| 2010/0080984 A1 | 4/2010 | Lee |
| 2011/0071013 A1 | 3/2011 | Newton et al. |
| 2012/0263582 A1 | 10/2012 | Foster et al. |
| 2015/0159492 A1* | 6/2015 | Hass ....................... C04B 41/89 428/448 |

OTHER PUBLICATIONS

Shimoo et al., "Synthesis of C-Sic Composite Fiber by Precursor Method," Journal of the Ceramic Society of Japan, International Edition, Fuji Technology Press, Tokyo, Japan, vol. 102, No. 9, Sep. 1, 1994, pp. 878-884.

* cited by examiner

- $O_2$ ingresses to interface
- $B_2O_3$ forms and bonds fiber to matrix
- Surface flaws grow with time

- $O_2$ ingresses reduced due to $SiO_2$ formation
- Crack front slowed down
- $SiO_2$ is *self-healing*

REACTIVE FIBER INTERFACE COATINGS FOR IMPROVED ENVIRONMENTAL STABILITY

CROSS REFERENCE TO RELATED APPLICATIONS

This application claims priority to and the benefit of U.S. Provisional Patent Application No. 61/779,590, filed 13 Mar. 2013, the disclosure of which is now incorporated herein by reference.

FIELD OF THE DISCLOSURE

The present disclosure relates generally to composite materials including fibers suspended in a matrix material. More specifically, the present disclosure relates to coatings for fibers included in ceramic matrix composites that are used in high-temperature mechanical systems such as gas turbine engines.

BACKGROUND

A gas turbine engine, such as an aircraft engine, operates in severe environments. Ceramic matrix composite (CMC) components have desirable high temperature mechanical, physical, and chemical properties which allow gas turbine engines to operate at much higher temperatures than current engines with superalloy components. For example, CMC components exhibit a significant amount of damage tolerance when under an applied load when compared to superalloy components. This damage tolerance is due in part to the formation of multiple matrix cracks that aid in the redistribution of stresses.

An issue with CMC components, however, is their lack of environmental durability in combustion environments. For example, the formation of matrix cracks may result in environmental exposure to the fiber and fiber interface coating (typically boron nitride (BN)), which over time, may cause environmental degradation of the CMCs. The environmental degradation of CMCs is temperature and environment dependent. For example, at low temperatures (e.g., below 1000° C.) oxygen may ingress to the fiber unimpeded causing environmental attack at the interface and resulting in embrittlement. At high temperatures (e.g., greater than 1000° C.), silicon dioxide ($SiO_2$) may be formed, which may impede oxygen transport and slow down the degradation of the fiber and the fiber interface. However, the formation of $SiO_2$ may be hindered if water vapor (a combustion reaction product) is present.

SUMMARY

The present application discloses one or more of the features recited in the appended claims and/or the following features which, alone or in any combination, may comprise patentable subject matter.

A multilayer interface coating for a fiber of a ceramic matrix composite may include a first interface coating layer deposited onto the fiber of the ceramic matrix composite, and a second interface coating layer deposited onto the first interface coating layer.

In some embodiments, the first interface coating layer may include a stable oxide layer. The first interface coating layer may also include at least one rare earth oxide selected from the group consisting of Yttrium(III) oxide, Ytterbium oxide, Erbium(III) oxide, Lutetium(III) oxide, and Dysprosium(III) oxide. In some embodiments, the first interface coating layer may also include a transition metal selected from the group consisting of Zirconium dioxide and Hafnium(IV) oxide. Additionally, in some embodiments, the second interface coating layer may include a silicon carbide layer.

In some embodiments, the first interface coating layer may have a thickness of between about 25 nanometers to about 100 nanometers. Additionally, in some embodiments, the second interface coating layer may have a thickness of between about 25 nanometers to about 100 nanometers.

In some embodiments, the fiber of the ceramic matrix composite may include a silicon carbide fiber. Additionally, in some embodiments, at least one of the first and second interface coating layers may be deposited via at least one of chemical vapor infiltration or chemical vapor deposition. The first and/or second interface coating layers may be deposited at a deposition temperature of about 300 degrees Celsius to about 1500 degrees Celsius.

In some embodiments, the multilayer interface coating for the fiber of the ceramic matrix composite may include a third interface coating layer deposited onto the second interface coating layer, and a fourth interface coating layer deposited onto the third interface coating layer. Additionally, in some embodiments, the third interface coating layer may include a stable oxide layer, and the fourth interface coating layer may include a silicon carbide layer.

According to another aspect of the present disclosure, a ceramic matrix composite material may include a matrix material, and a plurality of fibers embedded within the matrix material. Each of the plurality of fibers may include a multilayer interface coating. The multilayer interface coating for each of the plurality of fibers may include a first interface coating layer deposited onto a corresponding fiber of the plurality of fibers, and a second interface layer deposited onto the first interface coating layer.

In some embodiments, the first interface coating layer may include a stable oxide layer. The first interface coating layer may include at least one rare earth oxide selected from the group consisting of Yttrium(III) oxide, Ytterbium oxide, Erbium(III) oxide, Lutetium(III) oxide, and Dysprosium(III) oxide. In some embodiments, the first interface coating layer may also include a transition metal selected from the group consisting of Zirconium dioxide and Hafnium(IV) oxide. Additionally, in some embodiments, the second interface coating layer comprises a silicon carbide layer.

In some embodiments, the first interface coating layer may have a thickness of between about 25 nanometers to about 100 nanometers. Additionally, in some embodiments, the second interface coating layer may have a thickness of between about 25 nanometers to about 100 nanometers.

In some embodiments, one or more of the plurality of fibers may include a silicon carbide fiber. Additionally, in some embodiments, at least one of the first and second interface coating layers may be deposited via at least one of chemical vapor infiltration or chemical vapor deposition. The first and/or second interface coating layers may be deposited at a deposition temperature of about 300 degrees Celsius to about 1500 degrees Celsius.

In some embodiments, the multilayer interface coating for each of the plurality of fibers may further include a third interface coating layer deposited onto the second interface coating layer, and a fourth interface coating layer deposited onto the third interface coating layer. Additionally, in some embodiments, the third interface coating layer may include a stable oxide layer, and the fourth interface coating layer may include a silicon carbide layer.

According to another aspect of the present disclosure, a method for depositing a multilayer interface coating onto a fiber of a ceramic matrix composite may include depositing a first interface coating layer onto a fiber of a ceramic matrix composite, and depositing a second interface coating layer onto the first interface coating layer.

In some embodiments, the step of depositing a first interface coating layer onto a fiber of a ceramic matrix composite may include the step of depositing a stable oxide layer onto a fiber of a ceramic matrix composite. The step of depositing a first interface coating layer onto a fiber of a ceramic matrix may also include the step of depositing a rare earth oxide coating layer selected from the group consisting of Yttrium(III) oxide, Ytterbium oxide, Erbium(III) oxide, Lutetium(III) oxide, and Dysprosium(III) oxide. In some embodiments, the step of depositing a first interface coating layer onto a fiber of a ceramic matrix composite may include the step of depositing a transitional metal coating layer selected from the group consisting of Zirconium dioxide and Hafnium(IV) oxide. Additionally, in some embodiments, the step of depositing a second interface coating layer onto a fiber of a ceramic matrix composite may include the step of depositing a silicon carbide layer onto a fiber of a ceramic matrix composite.

In some embodiments, the step of depositing a first interface coating layer may include the step of depositing a first interface coating layer at thickness of between about 25 nanometers to about 100 nanometers. Additionally, in some embodiments the step of depositing a second interface coating layer may include the step of depositing a second interface coating layer at thickness of between about 25 nanometers to about 100 nanometers.

In some embodiments, the fiber of the ceramic matrix composite may include a silicon carbide fiber. Additionally, in some embodiments, the steps of depositing first and second interface coating layers may include the steps of depositing first and second interface coating layers via at least one of chemical vapor infiltration or chemical vapor deposition. In some embodiments, the step of depositing a first interface coating layer may include the step of depositing a first interface coating layer at a deposition temperature of about 300 degrees Celsius to about 1500 degrees Celsius. Additionally, the step of depositing a second interface coating layer may include the step of depositing a second interface coating layer at a deposition temperature of about 300 degrees Celsius to about 1500 degrees Celsius.

In some embodiments, the method may further include depositing a third interface coating layer onto the second interface coating layer, and depositing a fourth interface coating layer onto the third interface coating layer. Additionally, in some embodiments, the step of depositing a third interface coating layer may include the step of depositing a stable oxide layer. In some embodiments, the step of depositing a fourth interface coating layer may include the step of depositing a silicon carbide layer.

These and other features of the present disclosure will become more apparent from the following description of the illustrative embodiments.

DETAILED DESCRIPTION OF THE DRAWINGS

Figure 1A:
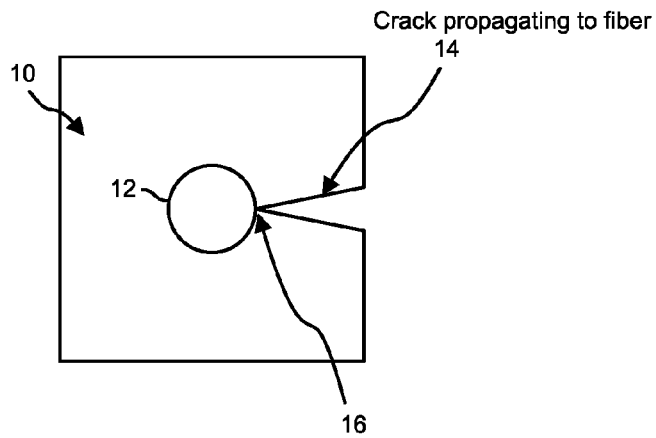
FIG. 1a is a cross-sectional diagram showing the environmental degradation of a ceramic matrix composite fiber including an interface coating at low temperatures.

For the purposes of promoting an understanding of the principles of the disclosure, reference will now be made to a number of illustrative embodiments illustrated in the drawings and specific language will be used to describe the same.

Ceramic matrix composites (CMC) exhibit a significant amount of damage tolerance when under an applied load. This damage tolerance is due to the formation of multiple matrix cracks that aid in the redistribution of stresses. However, the formation of matrix cracks can result in environmental exposure to the fiber and fiber interface coating (typically boron nitride (BN)). This exposure may, over time, cause environmental degradation of the fibers in a CMC material.

Figure 1B:
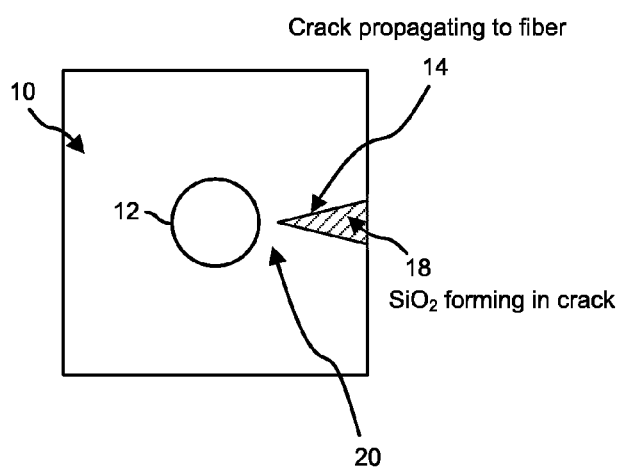
FIG. 1b is a cross-sectional diagram showing the environmental degradation of a ceramic matrix composite fiber including an interface coating at high temperatures.

Environmental degradation of CMC materials is temperature and environment dependent and eventually results in the failure of materials. FIGS. 1a-b show the environmental degradation of a CMC material in air at both high and low temperatures. In some embodiments, the CMC material includes one or more ceramic fibers (e.g., the fiber 12) arranged within a ceramic matrix 10. For example, the CMC material may be embodied may be embodied as a silicon-carbide-fiber-reinforced silicon carbide (SiC/SiC) CMC. Silicon carbide-silicon carbide composites are silicon carbide fibers in a silicon carbide matrix. In some embodiments, the fiber 12 may include a boron nitride interface coating. It should be appreciated that the CMC material may be embodied as any other type of CMC including fibers with other types of interface coatings.

Referring now to FIG. 1a, the environmental degradation in air of a fiber 12 including an interface coating (e.g., boron nitride) at low temperatures is shown. At low temperatures oxygen can ingress to the fiber 12 unimpeded via a crack 14 in the matrix 10 and cause environmental attack at the interface 16. Such an environmental attack may cause embrittlement, which may lead to material failure.

Referring now to FIG. 1b, the environmental degradation in air of the fiber 12 including the interface coating (e.g., boron nitride) at high temperatures is shown. Silicon dioxide ($SiO_2$) may be formed 18 in the crack 14 of the matrix 10 at temperatures above 1000° C. The formation of the silicon dioxide 18 impedes oxygen transport and slows down the degradation 20 of the fiber 12 and the fiber interface. In some embodiments, this self-healing occurs in air, but is severely hindered if water vapor is present.

Figure 2:
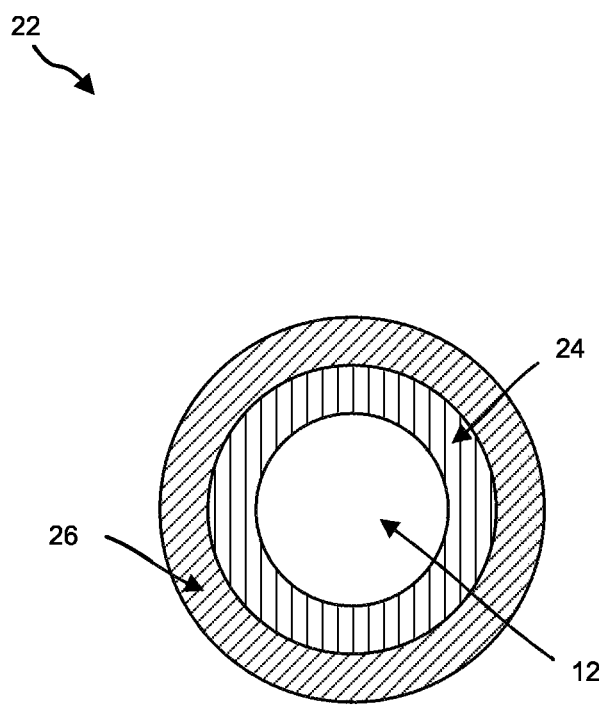
FIG. 2 is a cross-sectional diagram of a multilayer interface coating for fibers of ceramic matrix composites.

Referring now to FIG. 2, a coated fiber for use in a CMC is shown. The coated fiber includes a fiber 12 and a multilayer interface coating 22. In the illustrative embodiment, the fiber 12 contains silicon and carbon and is embodied as a silicon carbide fiber. In other embodiments, the fiber 12 may be embodied as one or more of a CG Nicalon fiber, a Hi-Nicalon fiber, a Hi-Nicalon Type S fiber, a Sylramic fiber, a Sylramic iBN fiber, a Tyranno ZMI fiber, a Tyranno SA fiber, a Tyranno SA3 fiber, and any other type of carbon-based fiber. In some embodiments, the multilayer interface coating 22 may be applied to fibers used in non-oxide fiber reinforced composites. It should also be appreciated that the multilayer coating 22 may be applied to other fibers used in other types of fiber reinforced composite.

In some embodiments, the multilayer interface coating 22 reduces low temperature embrittlement and improves water vapor resistance for ceramic matrix composite fibers such as, for example, the fiber 12. The multilayer interface coating 22 may also provide improved environmental stability to a SiC-based CMC material loaded above the matrix cracking stress. Additionally, the multilayer interface coating 22 may result in increased design margins, increased stress allowances, and improved life cycle costs. To do so, the multilayer interface coating 22 may utilize an oxidation reaction to form silicates, which may include a stabilizing rare earth metal/element (e.g., Y, Yb, Er, Lu, Dy, etc.) or a transition metal/element (e.g., Zr, Hf, etc.). To facilitate the formation of the silicates, the multilayer interface coating 22 may be embodied as alternating layers of a silicon containing compound (e.g., SiC, $Si_3N_4$, silicon carbonitride ($Si_xN_yC_z$), etc.) and a single phase oxide ($Y_2O_3$, $Yb_2O_3$, $ZrO_2$, etc.).

As illustratively shown in FIG. 2, the multilayer interface coating 22 includes two coating layers 24, 26. It should be appreciated that the multilayer interface coating 22 may include more or fewer coating layers. For example, the multilayer interface coating 22 may include a total number of coating layers ranging anywhere from two (2) layers to fifty (50) layers. Additionally, the total number of layers may depend on the individual layer thickness and fiber type.

The individual thickness of each layer may vary. For example, the individual thickness of each layer may range anywhere from about 25 nanometers to about 100 nanometers. Of course, it should be appreciated that each of the individual layers may have a thickness of less than 25 nanometers or greater than 100 nanometers in other embodiments. The thickness of each layer may adjusted upwardly or downwardly to achieve a desired stoichiometry of the reacted layers.

In embodiments, such as the one illustratively shown in FIG. 2, the fiber 12 includes two coating layers (e.g., a first layer 24 and a second layer 26). The illustrative first layer 24 (e.g., the layer coating the fiber 12) is an oxide layer deposited as an oxide. In some embodiments, the first layer 24 coating the fiber 12 may comprise a rare earth element and oxygen, wherein the rare earth element may be selected from Yttrium(III), Ytterbium, Erbium(III), Lutetium(III), and Dysprosium(III). In some embodiments, the first layer 24 coating the fiber 12 may comprise a transition metal and oxygen, wherein the transition metal is selected from Zirconium, Halfnium, etc. In some embodiments, the first layer 24 coating the fiber 12 may be a mixed oxide selected from the compounds $Y_2O_3ZrO_2$, $Yb_2O_3HfO_2$, etc. Additionally, the first layer 24 may provide a weak interface for fiber debonding may be embodied as a dense or a porous layer.

In a related embodiment, the first layer 24 shown in FIG. 2 may be formed by deposition of a carbide, nitride, or carbonitride of the transition metal or rare earth material, or a combination thereof (for example ZrC, $ZrC_xN_{1-x}$, $HfC_xN_{1-x}$, $YC_2$, YN, YbN, $Hf_xY_yC_zN_{1-z}$, etc) and a subsequent heat treatment to form a dense or porous oxide layer. The non-oxide coating could also be oxidized (usually forming a porous layer) through normal use at temperatures below 1000° C.

In some embodiments, the second layer 26 (e.g., the layer coating the first layer 24) comprises silicon and carbon and is embodied as a silicon carbide (SiC) layer. Of course it should be appreciated that the second layer 24 may instead be embodied as a layer including other elements or compounds. Additionally, the second layer 24 may be embodied as a dense or a porous layer.

As discussed, the multilayer interface coating 22 may instead include any number of coating layers. Thus, in embodiments such as the one illustratively shown in FIG. 2, the individual alternating layers 24, 26 may continue until the desired number of layers is achieved. In one preferred embodiment, about ten total layers are applied to the fiber 12. In other embodiments, fewer layers or up to about fifty alternating layers can be applied.

In some embodiments, an initial layer of boron nitride (BN) may be applied to the fiber 12 prior to the application of alternating layers 24, 26. Also, in some embodiments, layers of boron nitride may be interspersed at regular or irregular intervals between the alternating layers 24, 26. However, the outer layer of the multilayer interface coating 22 is not boron nitride.

In some embodiments, the individual alternating layers 24, 26 may be deposited via chemical vapor infiltration (CVI) and/or chemical vapor deposition (CVD). For example, each of the individual layers 24, 26 may be deposited using one or more of metal organic CVI, ultra-violet assisted CVI, physical vapor deposition, directed vapor deposition, and/or any other suitable technique for applying a coating and/or covering to a ceramic fiber such as, for example, the fiber 12.

It should be appreciated that the individual alternating layers 24, 26 may also be deposited onto a single multifilament silicon carbide tow or on fabrics that include multiple multifilament silicon carbide tows. Additionally, in some embodiments, the alternating layers 24, 26 may be deposited onto the ceramic fiber 12, the single multifilament silicon carbide tow, and/or fabrics that include multiple multifilament silicon carbide tows at deposition temperatures ranging from about 300° C. to about 1500° C. Alternatively, the alternating layers 24, 29 may be deposited onto the ceramic fiber 12, the single multifilament silicon carbide tow, and/or the fabrics including multiple multifilament silicon carbide tows at any other temperature and/or temperature range suitable for layer deposition. For example, in some embodiments, the deposition temperature may be determined based at least in part on, or otherwise as a function of, the deposition temperature, fiber type, and/or the desired crystalline content.

Figure 3A:
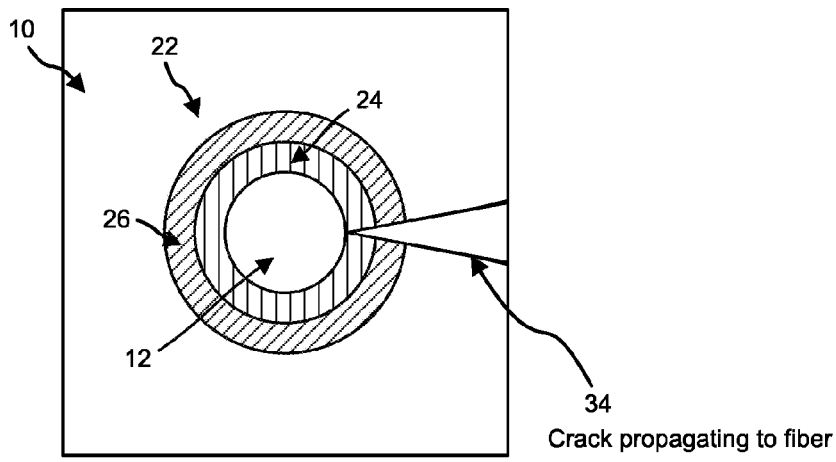
FIG. 3a is a cross-sectional diagram showing the environmental degradation at low temperatures of a fiber of a ceramic matrix composite including the multilayer interface coating of FIG. 2.

It should be appreciated that in embodiments such as the one illustratively shown in FIG. 2, the multilayer interface coating 22 may reduce environmental degradation or otherwise increase the environmental stability of the fiber 12 in CMC materials where matrix cracking occurs. Specifically, in some embodiments, the alternating layers (e.g., the layers 24, 26) may reduce low temperature embrittlement and improve water vapor resistance in ceramic matrices. For example, referring now to FIGS. 3a-b, the environmental degradation of a fiber 12 including the multilayer coating 22 at low and high temperatures is shown. As illustratively shown in FIG. 3a, a crack 34 in the matrix 10 may propagate to the fiber 12 in embodiments wherein the temperature is below 1000° C. As a result, oxygen may ingress to the fiber 12 via the crack 34.

However, as discussed, the multilayer coating 22 may include a surface oxide layer (e.g., the layer 24), which may impede and/or prevent the formation of a low and/or intermediate temperature oxide products that may be bound to the fiber 12 or the fiber interface. As such, in embodiments wherein the temperature is below 1000° C., the surface oxide layer (e.g., the layer 24) may impede and/or prevent the formation of oxide products (e.g., oxidation) and thereby prevent and/or reduce embrittlement. It should be appreciated that the surface oxide layer (e.g., the layer 24) may also impede and/or prevent the formation of oxide products (e.g., oxidation) in embodiments wherein the temperature is between about 800° C. and about 1000° C. As discussed, the layer 24 may be embodied as a stable oxide layer including one or more of a rare earth oxide and/or a transition metal oxide.

Figure 3B:
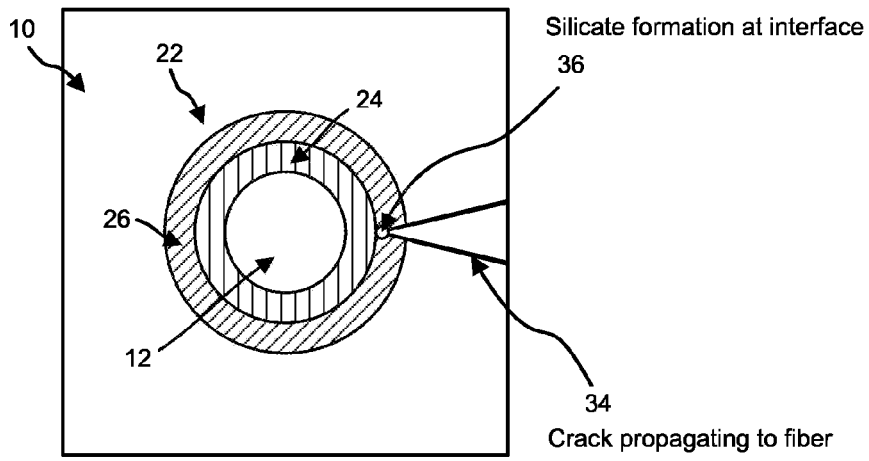
FIG. 3b is a cross-sectional diagram showing the environmental degradation at high temperatures of a fiber of a ceramic matrix composite including the multilayer interface coating of FIG. 2.

As illustratively shown in FIG. 3b, the crack 34 in the matrix 10 may propagate to the interface of the fiber 12 in embodiments wherein the temperature is above 1000° C. As discussed, the multilayer coating 22 may also include a silicon carbide layer (e.g., the layer 26), which may coat the surface oxide layer (e.g., the layer 24). As such, when temperatures are above 1000° C., silicon dioxide ($SiO_2$) may be formed in the silicon carbide layer (e.g., the layer 26). In such embodiments, the $SiO_2$ formed in the silicon carbide layer (e.g., the layer 26) may react with the surface oxide layer (e.g., the layer 24) to form a silicate 36. Additionally, the $SiO_2$ formed in the silicon carbide layer (e.g., the layer 26) may slow down the propagation of oxygen to the fiber 12 or the fiber interface. The silicate 36 formed from the reaction of the $SiO_2$ and the surface oxide layer (e.g., the layer 24) may improve the water vapor stability and, as a result, may improve component life if matrix cracking occurs.

Figure 4:
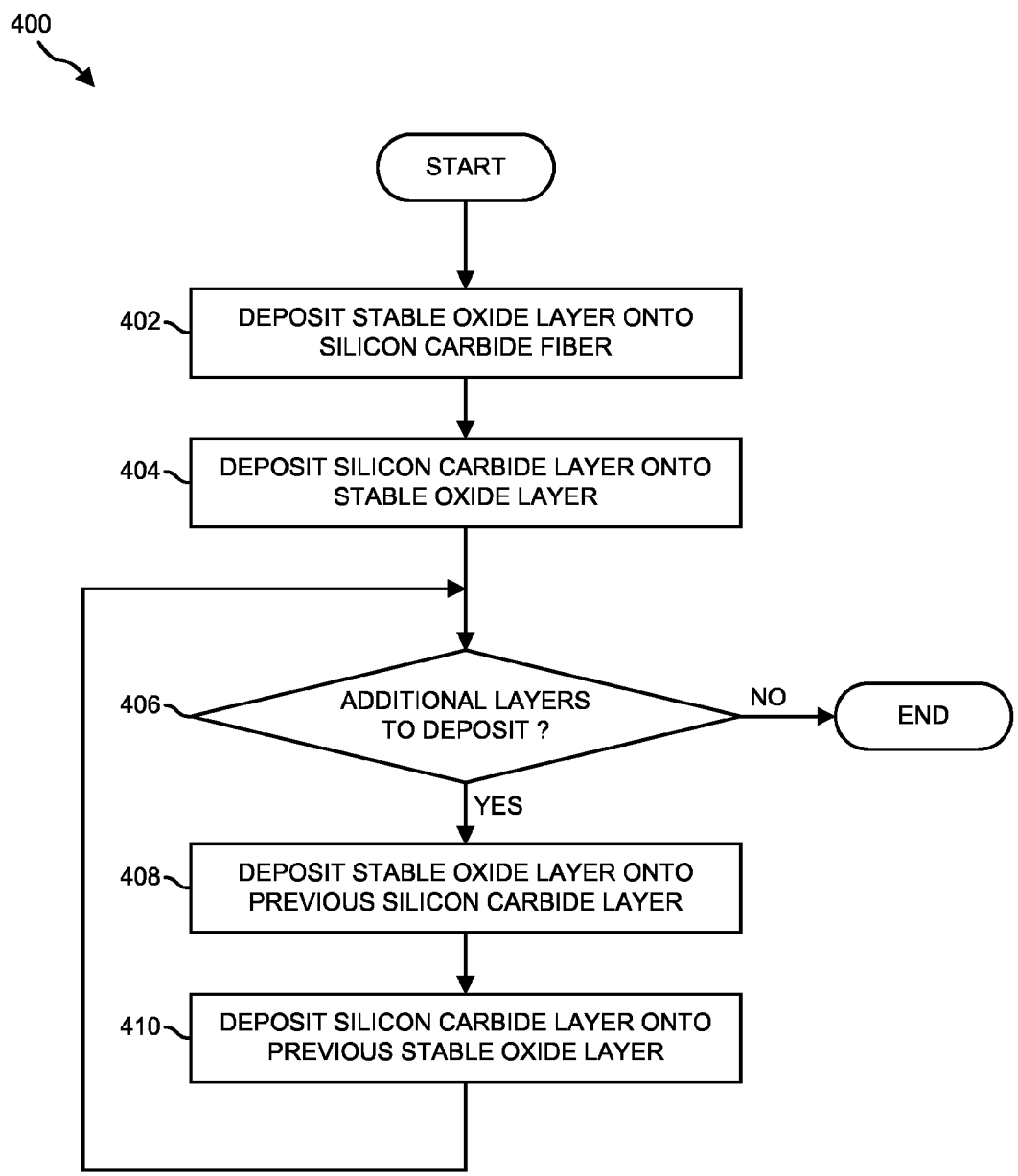
FIG. 4 is a simplified flow diagram of at least one embodiment of a method for manufacturing the multilayer interface coating of FIG. 2.

Referring now to FIG. 4, an illustrative embodiment of a method 400 for manufacturing the multilayer coating 22 is shown. The method begins in block 402, in which a silicon carbide fiber (e.g., the fiber 12) is coated with a stable oxide layer (e.g., the layer 24 shown in FIG. 2). As discussed, the stable oxide layer may include a rare earth oxide (e.g., $Y_2O_3$, $Yb_2O_3$, etc.) and/or a transition metal oxide (e.g., $ZrO_2$, $HfO_2$, etc.). Additionally, in some embodiments, the stable oxide layer (e.g., the layer 24 shown in FIG. 2) may be deposited onto the silicon carbide fiber using one or more of chemical vapor infiltration (CVI) and/or chemical vapor deposition (CVD). After depositing the stable oxide layer (e.g., the first layer 24 shown in FIG. 2), the method 400 advances to block 404.

In block 404, a silicon carbide (SiC) layer (e.g., the layer 26 shown in FIG. 2) may be deposited onto the stable oxide layer (e.g., the layer 24 shown in FIG. 2). In some embodiments, the SiC layer (e.g., the second layer 26 shown in FIG. 2) may be deposited on the stable oxide layer (e.g., the first layer 24 shown in FIG. 2) using one or more of chemical vapor infiltration (CVI) and/or chemical vapor deposition (CVD). After depositing the SiC layer (e.g., the second layer 26 shown in FIG. 2), the method 400 advances to block 406.

In block 406, it is determined whether additional layers are to be deposited onto the multilayer coating 22 (e.g., deposited onto a previous layer). If, at block 406, it is determined that additional layers are to be deposited, the method 400 advances to block 408. If it is instead determined that no additional layers are to be deposited, the method 400 completes.

In block 408, an additional stable oxide layer (not shown in FIG. 2) may be deposited onto the previously deposited SiC layer (e.g., the second layer 26 shown in FIG. 2, additional SiC layers, etc.). The additional stable oxide layer may be deposited onto the previously deposited SiC layer using one or more of chemical vapor infiltration (CVI) and/or chemical vapor deposition (CVD). The method 400 then advances to block 410.

In block 410, an additional SiC layer may be deposited onto the additional stable oxide layer that was previously deposited in block 408. The additional SiC layer may be deposited onto the additional stable oxide layer (e.g., the additional stable oxide layer previously deposited in block 408) using one or more of chemical vapor infiltration (CVI) and/or chemical vapor deposition (CVD). The method 400 may return to block 406 in which it is determined whether additional layers are to be deposited onto the multilayer coating 22 (e.g., deposited onto a previously deposited layer).

Of course, it should be appreciated that in some embodiments, block 410 may not be performed based at least in part on, or otherwise as a function of, design considerations. That is, in some embodiments, the additional SiC layer may not always be deposited onto the additional stable oxide layer (e.g., the additional stable oxide layer previously deposited in block 408). In such embodiments, the resulting multilayer coating 22 may include an odd number of layers.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A composite material comprising:
a matrix, and
a plurality of coated fibers suspended in the matrix, the coated fibers each including a fiber and a multilayer interface coating deposited on the fiber,
wherein the multilayer interface coating includes an oxide layer, a silicon containing compound layer, and a silicate that is formed at an interface of the oxide layer and the silicon containing compound layer and that is disposed between the fiber and the matrix, and wherein the oxide layer and the silicon containing compound layer are in direct contact with each other along the interface adjacent to the silicate.

2. The composite material of claim 1, wherein the silicate is formed as the result of an oxidation reaction between the oxide layer and the silicon containing compound layer when the temperature of the multilayer interface coating is raised above 1000 degrees Celsius.

3. The composite material of claim 1, wherein the fibers of the coated fibers include silicon carbide.

4. The composite material of claim 3, wherein the silicon containing compound layer includes silicon carbide.

5. The composite material of claim 3, wherein the matrix is a ceramic matrix including silicon carbide.

6. The composite material of claim 3, wherein the oxide layer is a rare earth oxide.

7. The composite material of claim 6, wherein the oxide layer includes at least one of Yttrium(III) oxide, Ytterbium oxide, Erbium(III) oxide, Lutetium(III) oxide, and Dysprosium(III) oxide.

8. The composite material of claim 3, wherein the oxide layer includes a transition metal.

9. The composite material of claim 8, wherein the oxide layer includes at least one of Zirconium dioxide and Hafnium(IV) oxide.

10. The composite material of claim 1, wherein each of the oxide layer and the silicon containing compound layer has a thickness of between about 25 nanometers to about 100 nanometers.

11. The composite material of claim 1, wherein at least one of the oxide layer and the silicon containing compound layer is porous.

12. A coated fiber for use in a composite material, the coated fiber comprising:
a fiber and a multilayer interface coating deposited on the fiber,
wherein the multilayer interface coating includes an oxide layer, a silicon containing compound layer, and a silicate that is formed by the oxide layer and the silicon containing compound layer and that is disposed adjacent to the fiber such that in use in the composite material the silicate is disposed between the fiber and a matrix of the composite material, and wherein the silicate is formed at an interface of the oxide layer and the silicon containing compound layer, and the oxide layer and the silicon containing compound layer are in direct contact with each other along the interface adjacent to the silicate.

13. The coated fiber of claim 12, wherein the silicate is formed as the result of an oxidation reaction between the oxide layer and the silicon containing compound layer when the temperature of the multilayer interface coating is raised above 1000 degrees Celsius.

14. The coated fiber of claim 12, wherein the silicon containing compound layer includes silicon carbide.

15. The coated fiber of claim 14, wherein the fibers of the coated fibers include silicon carbide tows.

16. The coated fiber of claim 15, wherein the oxide layer forms a first layer and the silicon containing compound layer forms a second layer and the second layer is arranged further from the fiber than the first layer.

17. The coated fiber of claim 16, wherein the second layer is porous.

18. The coated fiber of claim 14, wherein the silicon containing compound layer is porous.

* * * * *